United States Patent
Biber

(10) Patent No.: US 9,541,619 B2
(45) Date of Patent: Jan. 10, 2017

(54) BALANCING OUT A FIELD INHOMOGENEITY IN A MAGNETIC RESONANCE TOMOGRAPHY SYSTEM AND SHIM COIL ARRANGEMENT

(71) Applicant: Stephan Biber, Erlanger/Frauenaurach (DE)

(72) Inventor: Stephan Biber, Erlanger/Frauenaurach (DE)

(73) Assignee: Siemens Aktiengesellschaft, München (DE)

( * ) Notice: Subject to any disclaimer, the term of this patent is extended or adjusted under 35 U.S.C. 154(b) by 947 days.

(21) Appl. No.: 13/689,339

(22) Filed: Nov. 29, 2012

(65) Prior Publication Data

US 2013/0134978 A1    May 30, 2013

(30) Foreign Application Priority Data

Nov. 30, 2011 (DE) .......................... 10 2011 087485

(51) Int. Cl.
*G01R 33/3875* (2006.01)

(52) U.S. Cl.
CPC ................................. *G01R 33/3875* (2013.01)

(58) Field of Classification Search
CPC .................................................... G01R 33/375
USPC ........................................................ 324/320
See application file for complete search history.

(56) References Cited

U.S. PATENT DOCUMENTS 4,607,225 A * 8/1986 Crooks .......................... 324/318
4,689,707 A * 8/1987 Schwall ................... H01F 6/006
        335/216
4,954,924 A * 9/1990 Haragashira ....... G01R 33/3621
        361/187
5,343,151 A * 8/1994 Cory ................... G01R 33/3875
        324/319
5,602,480 A * 2/1997 Onodera ............ G01R 33/3875
        324/309

(Continued)

FOREIGN PATENT DOCUMENTS

CN        2136011 Y      6/1993
CN        1572243 A      2/2005
(Continued)

OTHER PUBLICATIONS

German Office Action dated Aug. 22, 2012 for corresponding German Patent Application No. DE 10 2011 087 485.2 with English translation.

(Continued)

*Primary Examiner* — Dixomara Vargas
(74) *Attorney, Agent, or Firm* — Lempia Summerfield Katz LLC

(57) ABSTRACT

In order to balance out a field inhomogeneity, a value for a coil current is determined by a controller as a function of an item of information relating to the field inhomogeneity and an item of information relating to a position of at least one balancing or shim coil arranged in the magnetic field. The value is to be supplied to the at least one shim coil in order to generate a magnetic balancing field to balance out the field inhomogeneity. A control signal for at least one shim current source and for at least one switching matrix coupling the at least one shim current source to the at least one shim coil is generated as a function of the at least one value.

14 Claims, 5 Drawing Sheets

(56) References Cited

U.S. PATENT DOCUMENTS

| | | | |
|---|---|---|---|
| 5,650,724 A * | 7/1997 | Yamagata | G01R 33/3875 324/320 |
| 5,701,075 A * | 12/1997 | Xu et al. | 324/318 |
| 5,754,047 A * | 5/1998 | Onodera | G01R 33/3875 324/309 |
| 5,932,936 A * | 8/1999 | Potthast et al. | 307/113 |
| 6,014,069 A * | 1/2000 | Havens et al. | 335/216 |
| 6,265,960 B1 * | 7/2001 | Schauwecker | G01R 33/421 324/320 |
| 6,452,374 B1 | 9/2002 | Kreischer | |
| 6,788,060 B1 | 9/2004 | Feenan et al. | |
| 6,816,046 B1 | 11/2004 | Varney | |
| 6,977,571 B1 * | 12/2005 | Hollis | G01R 33/288 324/319 |
| 7,570,141 B2 * | 8/2009 | Hollis | G01R 33/3875 335/216 |
| 9,322,891 B2 * | 4/2016 | Biber | G01R 33/341 |
| 9,360,541 B2 * | 6/2016 | Biber | G01R 33/3875 |
| 2007/0279060 A1 | 12/2007 | Dannels et al. | |
| 2009/0189744 A1 * | 7/2009 | Wang et al. | 340/10.42 |
| 2009/0237077 A1 * | 9/2009 | Vaughan | 324/307 |
| 2011/0089943 A1 | 4/2011 | Abe et al. | |

FOREIGN PATENT DOCUMENTS

| | | |
|---|---|---|
| CN | 1934458 A | 3/2007 |
| CN | 102046083 A | 5/2011 |
| DE | 199 28 428 A1 | 1/2001 |
| JP | 2005278805 A | 10/2005 |

OTHER PUBLICATIONS

M. L. Jayatilake et al., "Construction and Optimization of Local 3rd Order Passive Shim System for Human Brain Imaging at 4T MRI," Proc. Intl. Soc. Mag. Reson. Med. 19, p. 3785, 2011.

C. Juchem et al., "Dynamic Multi-Coil Shimming of the Human Brain at 7 Tesla," Proc. Intl. Soc. Mag. Reson. Med. 19, p. 716, 2011.

S. K. Lee et al., "B0 Shimming in 3T Bilateral Breast Imaging with Local Shim Coils," Proc. Intl. Soc. Mag. Reson. Med. 19, p. 715, 2011.

R. Salomir et al., "A Fast Calculation Method for Magnetic Field Inhomogeneity due to an Arbitrary Distribution of Bulk Susceptibility," Concepts in Magnetic Resonance Part B, vol. 19B(1), pp. 26-34, 2003.

Chinese Office action for related Chinese Application No. 201210504451, dated Oct. 10, 2015, with English Translation.

Salomir, R., de Senneville, B. D. and Moonen, C. T. (2003), A fast calculation method for magnetic field inhomogeneity due to an arbitrary distribution of bulk susceptibility. Concepts Magn. Reson., 19B: 26-34. doi: 10.1002/cmr.b.10083.

* cited by examiner

BALANCING OUT A FIELD INHOMOGENEITY IN A MAGNETIC RESONANCE TOMOGRAPHY SYSTEM AND SHIM COIL ARRANGEMENT

This application claims the benefit of DE 10 2011 087 485.2, filed on Nov. 30, 2011, which is hereby incorporated by reference.

BACKGROUND

The present embodiments relate to a magnetic resonance tomography (MRT) system, in which a current for a balancing or shim coil may be generated as a function of an item of information relating to a field inhomogeneity in a magnetic field of the MRT system.

Imaging in magnetic resonance tomography (e.g., magnetic resonance imaging (MRI)) is based on an alignment of spins of atomic nuclei through a magnetic base field or $B_0$ field of the MRT system. Attempts are made to provide as homogenous a base field as possible that has a constant field strength (e.g., both with respect to amount and direction) in a relatively large area.

The homogeneity of the base field is important for many applications for the image quality and also for the spatial registration of the images (e.g., the assignment of image regions that correspond to one another in two or more images). In order, for example, to improve the diagnostic useability of a magnetic resonance image (MR image), the fat saturation enables the relatively strong signals from fat tissue to be filtered out. With the spectral fat saturation and the techniques used, the fact that fat and water have slightly different resonant frequencies is utilized. The deviation is however minimal. The deviation may amount to 3.1 ppm (parts per million), which provides that with a Lamor or resonant frequency of 10 MHz, there is only a difference of 31 Hz. With this weak deviation, the signal of the fat may be suppressed through a strong transmit pulse at the fat frequency without influencing the imaging of the protons belonging to the water molecules. The functionality of all techniques that are based on the spectral separation of fat and water also depends on the homogeneity of the base field. If the base field varies in a similar order of magnitude to the spectral separation of fat and water (e.g., approximately 3 ppm), then the fat and water resonances may be at the same frequency. As a result, the fat and water resonances may no longer be spectrally separated.

With current superconducting magnets, a structurally-specific magnetic field inhomogeneity may be reduced to approximately 1 ppm and less in a volume of approximately 30×40×50 cm. Problems with fat saturation results, for example, in border areas of these regions if a patient to be examined has wide shoulders, for example, that protrude from the volume with a homogenous field. In order to enlarge the volume with the homogenous magnetic field, in addition to the base field generated by the superconducting magnetic coil, this base field may be overlaid with a balancing field using balancing or shim coils. The inhomogeneities may be compensated for at the borders of the volume using the balancing or shim coils. Such shim coils may be fastened to the superconducting magnets. The shim coils are supplied with an electrical current by a shim current source in each instance, the current strength of which is set within the scope of adjusting the MRT system by the service personnel.

The inhomogeneities introduced by the tissue of a patient are more critical than the deterministic $B_0$ inhomogeneities that may be measured in advance. For example, discontinuities of air and tissue result in significant $B_0$ distortions. The inhomogenous distribution of water, air, bones and fat in the human body also result, on account of the spatial susceptibility distribution, in a distortion of the $B_0$ base field that differs for each patient.

SUMMARY AND DESCRIPTION

The present embodiments may obviate one or more of the drawbacks or limitations in the related art. For example, high quality magnetic resonance (MR) images in a magnetic resonance tomography (MRT) system are acquired.

The MRT system enables shim coils to be operated locally where inhomogeneities introduced through tissue of a patient are produced, for example. The MRT system has a plurality of shim coil connections, to which at least one shim coil may be connected in each instance for generating a magnetic balancing field. Shim coils may therefore be operated where required (e.g., on a shoulder of a patient disposed in the magnetic field). The MRT system also includes a controller that is embodied to generate a control signal as a function of an item of information about the field inhomogeneity. At least one controllable shim current source is coupled to the controller. The shim current source is configured to generate a coil current as a function of the control signal.

In order to be able to supply the coil current of the at least one shim current source to the shim coils, the at least one shim current source is coupled to the plurality of shim coil connections via a controllable switching matrix.

The MRT system is advantageous in that shim coils may be operated locally (e.g., close to the patient) via the plurality of shim coil connections (e.g., at a distance of less than 30 cm or less than 15 cm). Wherever a shim coil is required, the shim coil may be connected to one of the shim coil connections. A corresponding shim current source may not be provided for each of the shim coils. Instead, a cost-efficient distribution and/or combination of coil currents is enabled in order to provide the local shim coils using the controllable switching matrix. The shim coil arrangement with a low hardware outlay and correspondingly low manufacturing costs may therefore be adjusted as flexibly as possible to the requirements for an MR examination to be implemented. A coupling field is formed by the switching matrix, using which a coil current of a shim current source may optionally be fed to at least one of the shim coil connections or also simultaneously to several of the same. The switching matrix may be realized, for example, by a crossbar distributor.

A method may be implemented using the MRT system in order to balance out a field inhomogeneity in a magnetic field of an MRT system. A position of at least one shim coil arranged in the magnetic field is determined by the controller as a function of the item of information relating to the field inhomogeneity and a further item of information relating to a position of at least one shim coil arranged in the magnetic field. A coil current (e.g., current strength and flow direction) of the at least one shim coil is to be supplied in order to generate a magnetic balancing field to balance out the field inhomogeneity. A control signal for the at least one shim current source and also for at least one switching matrix is generated as a function of the at least one value for the coil current. By setting the shim currents and prespecifying the switching combination in the switching matrixes, a configuration, by which at least the required balancing field is approximately generated, is generated overall. The method also enables inhomogeneities (e.g., not structurally specific but caused by the presence of a body in the magnetic field) to be compensated for at least partly.

For an examination of a patient, corresponding shim coils may not have to be connected to all shim coil connections. The switching matrix allows the shim coil sources to be freely linked to the shim coil connections. This is why more shim coil connections may be provided than shim current sources in the MRT system.

The free connectability of the shim current sources to the individual shim coil connections enables the shim current sources in the MRT system that differ and are specialized for different examination procedures to be provided. At least two shim current sources that differ in at least one of the following properties may therefore be provided: a maximum generateable current strength, a setting accuracy for a current strength and a switching bandwidth. The switching bandwidth is a measure of the delay, with which current strengths in shim current sources are adjusted to a change in the control signal of the controller.

With the MRT system, a coil current with a current strength may be provided in order to operate a shim coil. The shim coil current is not solely generateable by one of the shim current sources. The switching matrix may be embodied as a combination matrix. Currents of at least two shim current sources may be overlayed and may be supplied to at least one shim current connection.

In order also to be able to dynamically adjust the balancing field during a course of a measuring sequence, one embodiment of the MRT system provides that at least one shim current source is embodied as a constant current source, in which a switching bandwidth is larger than a switching bandwidth of a gradient system of the MRT system. The balancing field, which is adjustable more quickly than the region that is currently being evaluated by changing the gradient field.

At least one of the shim coil connections may be integrated in a receive coil socket, via which a receiver may be coupled to the MRT system. A receiver may be a measuring element that includes at least one receive coil for receiving an MR signal. A receive coil socket may be the connection device for a receiver that is known from the prior art. By integrating a shim coil connection in a receive coil socket, shim coils may be operated close to the receive coils without any additional wiring outlay (e.g., at the location, at which the homogenous field is also required).

In the event that shim coil connections in the MRT system extend across a large area (e.g., are provided along a patient couch), a switching matrix may be provided to reduce the switching outlay that only includes a partially occupied matrix arrangement. For example, shim coil connections on the foot side and, at the same time, also shim coil connections on the head side may not be powered. Corresponding switching combinations may therefore be dispensed with by omitting the corresponding switch in the matrix arrangement. This results in a further simplification of the switching matrix and barely represents a restriction for the useability of the MRT system for current examinations.

A dual useability of the shim coil sources is produced by providing at least one switch, via which a current of at least one shim current source may optionally be deflected from a shim coil and toward a positive intrinsic negative (PIN) diode of a tuning switching circuit. During the emission of the excitation signal (e.g., transmit pulse), receive coils of the MRT system are protected from an overvoltage, for example, using such tuning switching circuits. The tuning circuits are therefore only to be operated between the individual measurements during the excitation (e.g., only when no coil current is required in the shim coils).

The shim coils may be embodied so as to be removably connected (e.g., reversibly and non-destructively detachable) via the shim coil connections. A corresponding shim coil arrangement that includes a housing to be attached to a body of a patient to be examined, in which shim coils are integrated, is also provided. The shim coil arrangement may be connected to the MRT system using a plug in order to provide the shim coils with current. The plug is not coupled directly to the shim coils, but the plug and the shim coils are instead coupled via a controllable switching matrix integrated in the housing.

The shim coil arrangement is advantageous in that more shim coils may be integrated in the housing than there are shim coil connections required for operation. The coil current received via the plug may be supplied to the shim coils using the controllable switching matrix. A number of switching matrix arrangements may exist overall in the MRT system (e.g., a stationary shim coil arrangement that is integrated in the MRT system and a further shim coil arrangement that may be moved freely). Accordingly, signals for all of the switching matrixes are generated by the controller of the MRT system.

The shim coil arrangement may be, for example, one of the local receivers that may be attached to a patient. In this case, at least one receive coil is also integrated in the housing.

A switch may be provided in the shim coil arrangement, via which a coil current received via the plug may optionally either be fed to a shim coil or to a PIN diode of a tuning circuit of the receive coil.

Aside from the freely moveable shim coil arrangements, the MRT system may also include at least one shim coil that is installed at a fixed location permanently in the MRT system (e.g., in a patient couch). Such a shim coil may also be connected to one of the shim coil connections and be supplied with a coil current from at least one of the shim current sources via the switching matrix.

DETAILED DESCRIPTION OF THE DRAWINGS

Figure 1:
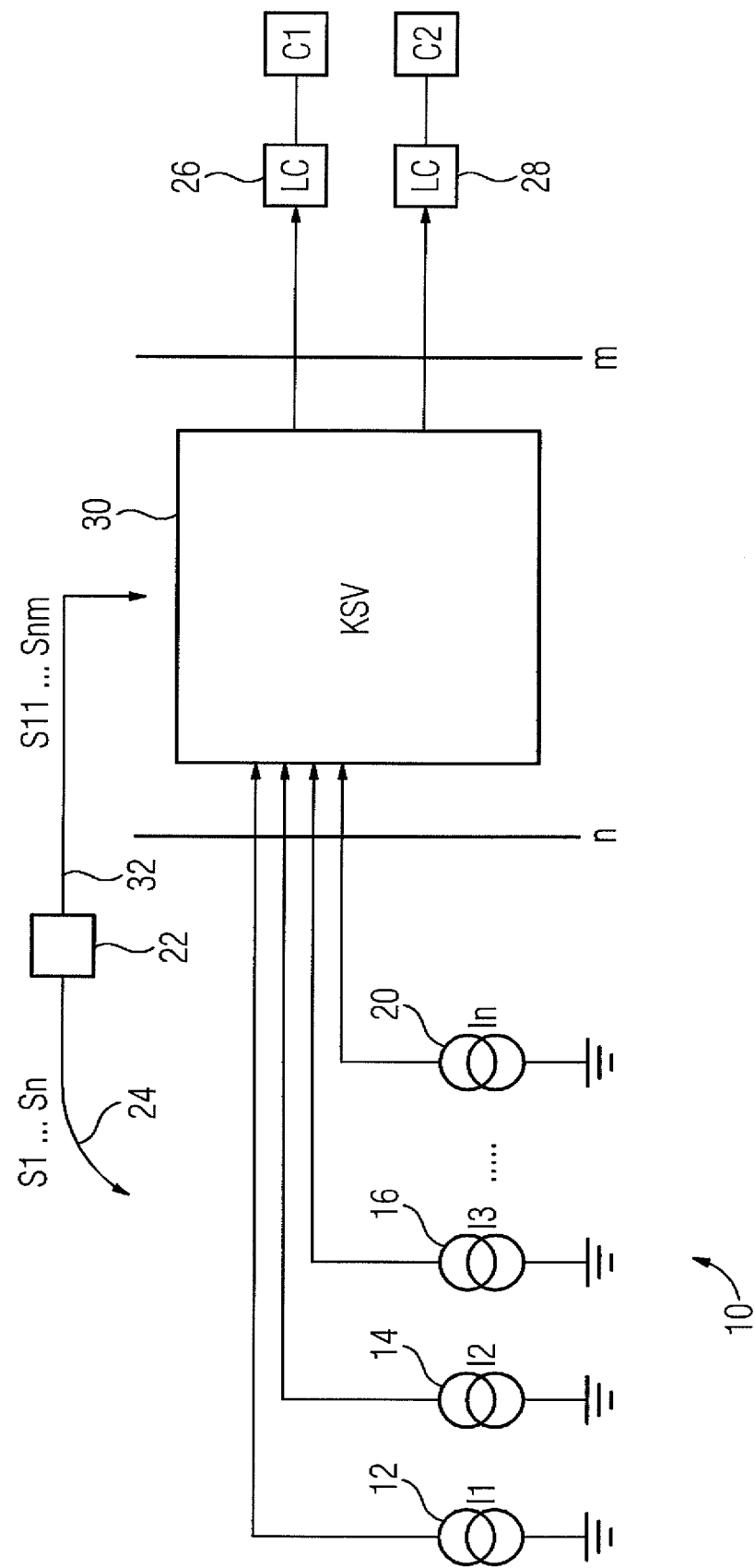
FIG. 1 shows a shim system of one embodiment of a magnetic resonance tomography (MRT) system.

FIG. 1 shows one embodiment of a shim system 10 of a magnetic resonance tomography (MRT) system (not shown in further detail), using which inhomogeneities specified both structurally and also by the presence of a body of a patient may be balanced out in a magnetic field of the MRT system. With the shim system 10, n shim current sources 12 to 20 may be controlled overall by a controller 22 (e.g., a switching device). The shim current sources 12 to 20 may be arranged in a magnetically shielded cabin together with the patient couch and the superconducting magnetic coil of the MRT system. The controller 22 may be one or several microcontrollers, for example. In order to control the shim current sources 12 to 20, the controller 22 sends control signals S1 to Sn to the shim current sources 12 to 20 via one or more control lines 24. Coil currents I1 to In are set by the shim current sources 12 to 20 as a function of the control signals S1 to Sn. A control signal is, for example, a signal that may include both analog voltage curves and also digital data. Switching and configuration parameters and trigger signals for changing an operating state of the controlled element may be transmitted by the control signal, for example.

With the shim system 10, the currents I1 to In ($n \geq 1$) are distributed onto m shim coil connections ($m \geq 1$). The shim coil connections may be found, for example, in coil sockets (LC-Local Connector) 26, 28 for connecting receive coils. In such cases, more than one shim coil connection may be provided in a receive coil socket 26, 28. A receiver C1, C2 may be connected to the coil socket 26, 28 in each case. One or more shim coils and one or more receive coils may be disposed in the receiver C1, C2.

The overall m shim coil connections are coupled to the n shim current sources 12 to 20 via a switching matrix 30. The switching matrix 30 may be a crossbar distributor, for example. The individual switches that are disposed in the crosspoints of the switching matrix 30 are switched by corresponding switching signals S11 to Snm, which are transmitted from the switching device 22 to the switching matrix 30 via control lines 32. The switching matrix 30 includes an interface for the switching process, via which the switching signals S11 to Snm may be received.

The control signals S1 to Sn, S11 to Snm are set by the controller 22 such that the coil currents I1 to In in the shim coils of the receivers C1, C2 generate a balancing field, by which an inhomogeneity in the magnetic field of the MRT system is balanced out. Information relating to the inhomogeneity is stored in the controller 22. The information may have been obtained, for example, by a general measurement that is implemented for a patient disposed in the magnetic field prior to an actual examination.

Each shim current source 12 to 20 may generate a specific current I1 to In with a specific accuracy. Not all shim current sources 12 to 20 have to generate the same maximum current.

The switching matrix 30 may fulfill a number of functions. For an arrangement including, for example, n=4 shim current sources 12 to 20 and 8 local coil sockets (only the two local coil sockets 26 and 28 therefore are shown in FIG. 1) with 2 shim coil connections in each instance (this results in m=16), the switching matrix 30 enables the n shim currents I1 to In to be distributed on m=16 arbitrarily selectable shim current connections. As a result, considerably fewer shim current sources are provided than shim coil connections.

In a further embodiment of the shim system 10, the switching matrix 30 also enables individual shim current sources 12 to 20 to be connected in parallel to a single shim coil connection. As a result, currents I1 to In overlay in the switching matrix 30. As a result, the currents from up to $n \geq a$ shim current sources 12 to 20 may be made available via the a=2 shim coil connections, for example, in one of the coil sockets 26, 28. As a result, more shim current (e.g., the entire shim current I1+I2+I3 . . . +In from all n shim current sources) may be made available to this shim coil connection. The different properties of various shim current sources may be effectively combined with one another. In one embodiment, one shim current source may be provided in a very accurately settable manner, and one shim current source, by contrast, may be provided with only minimal accuracy but with a large electrical output. A cost-effective, slow switching shim current source may be combined with an expensive, rapidly switchable shim current source.

An only partial occupation of the described switching matrix 30 with switching elements also enables a similar, but possibility restricted flexibility to be achieved in terms of connectability. The coil sockets at a head end may not, for example, also be powered at the same time as powering the coil sockets at a foot end.

The shim current sources 12 to 20 may be configured for the provision of the coil currents for the shim coils. The switching matrix 30 and/or the shim current sources 12 to 20 may either be embodied almost statically or in a rapidly switchable manner. Mixed solutions may also be provided. Depending on the size and embodiment of the MRT system, currents in the range of approximately 100 mA to 10 A are able to be provided or switched (e.g., direct currents). The switching matrix for the shim current sources also differs from a high frequency (IV) crossbar distributor (e.g., above 10 MHz). Such a HF crossbar distributor is known from the prior art, so that high frequency receive signals (HF signals) are transmitted from the receive coils to receive circuits. With such a HF crossbar distributor, almost powerless HF signals are switched with a current strength of a few milliamperes.

Examples of possible embodiments of a switching matrix for one embodiment of an MRT system are described below with the aid of FIG. 2 to FIG. 4.

Figure 2:
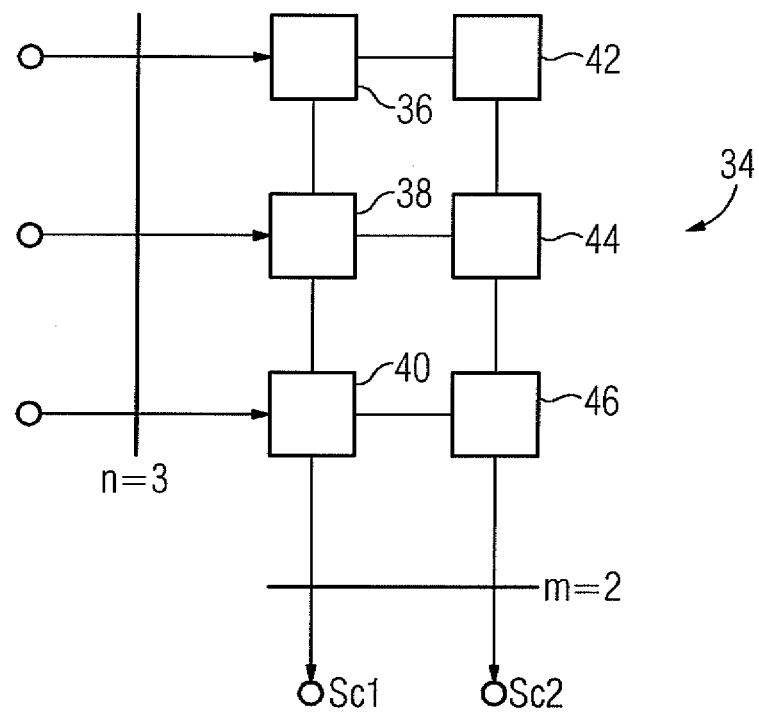
FIG. 2 shows one embodiment of a switching matrix of the MRT system.

FIG. 2 shows one embodiment of a switching matrix having a matrix arrangement 34 including switching elements 36 to 46 that include n=3 current inputs and only m=2 current outputs. With this switching matrix, different types of shim current sources may be coupled via the n=3 inputs to the only m=2 shim coil connections. The selection shown in FIG. 2 includes n=3 inputs and m=3 outputs, is only exemplary and does not represent any restriction for the subsequent explanations with respect to the embodiment of the matrix arrangement 34.

The switching elements 36 to 46 may be integrated in an individual component as integrated switches. The circuit arrangement 34 may also be composed of discrete components. The switching elements 36 to 46 may be realized, for example, as transistors (e.g., complementary metal oxide semiconductor (CMOS) transistors or insulated gate bipolar transistor (IGBT) transistors) or also as relays. No special requirements may be placed on the switching elements in order to realize the present embodiments.

Figure 3:
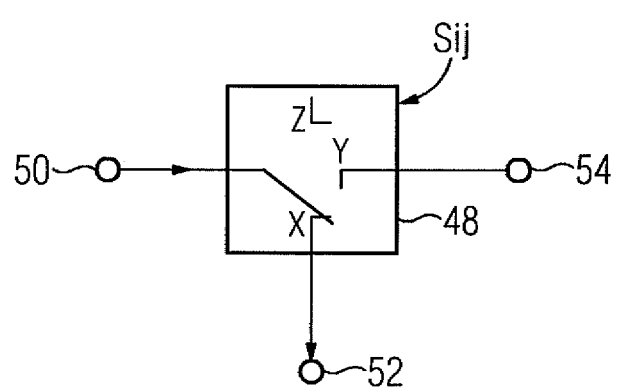
FIG. 3 shows one embodiment of a switching element for a switching matrix of the MRT system.

FIG. 3 illustrates, for example, which possible switching states a single switching element 48 of a matrix arrangement (not shown) of a switching matrix may assume. The switching element 48 includes a current input and two current outputs. The switching element 48 receives one of the control signals (e.g., control signal Sij (i'th column, j'th row of the matrix arrangement)) via a control input (not shown). The input current of the current input 50 is routed in a switch setting x to the current output 52, in a switch setting y to the current output 54. The switch element 48 is completely blocked in a switch setting z.

Figure 4:
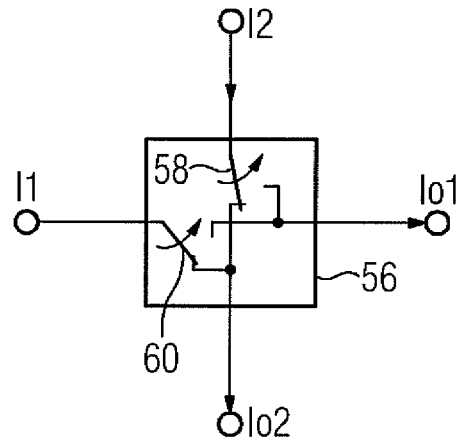
FIG. 4 shows one embodiment of a switching element for a switching matrix of a further embodiment of the MRT system.

FIG. 4 shows one embodiment of a switch element 56, by which two input currents I1, I2 may be combined to form total currents (e.g., either a total current Io1 or Io2). The switching element 56 overall includes two switchable elements 58, 60. With corresponding control of the switchable elements 58, 60, as is shown in FIG. 4, output currents Io2=I1+I2 and Io1=0 result, as shown in FIG. 4.

Figure 5:
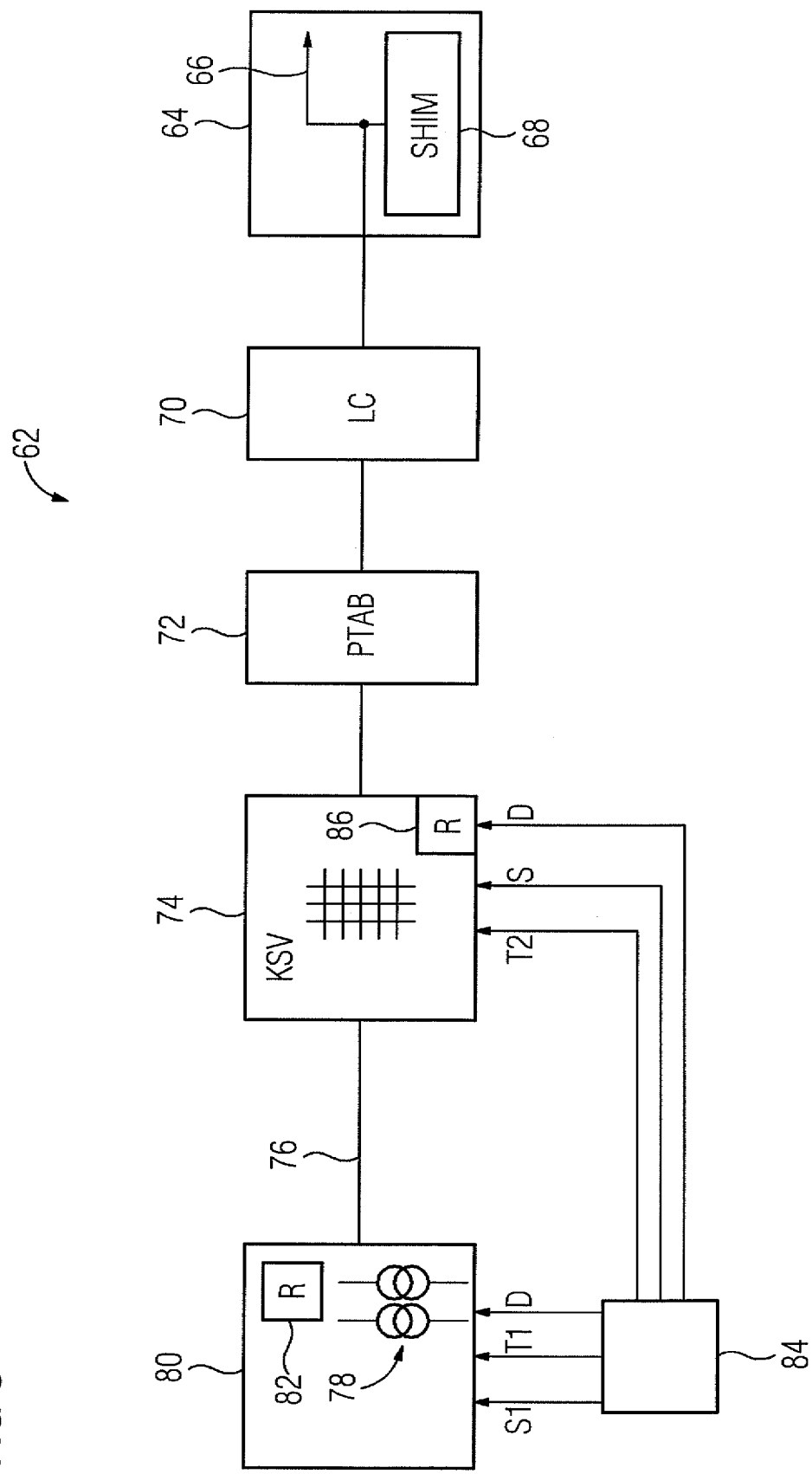
FIG. 5 shows one embodiment of the MRT system.

FIG. 5 shows an exemplary tomograph 62, in which one or more receive coils 66 and one or more shim coils 68 (SHIM) are integrated to balance out magnetic field inhomogeneities in a receiver 64. The receiver 64 may, for example, be a receiver integrated in a patient couch or (as shown in FIG. 5) a measurement element of the MRT system that is freely moveable and may be reversibly detached by way of a coil socket 70 of a patient couch 72. The coil socket 70 is coupled to a switching matrix 74 via the patient couch 72. The switching matrix 74 receives coil currents for the shim coils 68 from a plurality of shim current sources 78 via several current lines 76 and further shim coils arranged in other receive devices not shown for the sake of clarity.

The shim current sources 78 are combined in a current source module 80. A register 82 that represents a memory for storing settings that are to be rapidly called up for control of the shim current sources 78 is found in the current source module. The current source module 80 receives a control signal S1 from a controller 84 of the MRT system 62 for setting the current and also a trigger signal T1. The switching state of the switching matrix 72 is set by the controller 84 via a second control signal S. The controller 84 also generates data for the register 82 and a further register 86 of the switching matrix 74. The register 86 also represents a memory for storing settings for the rapid ability to call up. Aside from the control signals S1 and S, the controller 84 also generates the trigger signals T1 and T2.

Control signals S1 and S may be set, for example, as a function of an item of information relating to the field inhomogeneities for each measurement. The trigger signals enable stored settings to be called up from the registers 82 and 86 and the called-up values then to be defined as current control parameters. A rapid switchover in the module 80 and in the switching matrix 74 may be reached in order to be able to adjust the balancing field of the shim coils 68 to a layer selection of a measurement sequence or, for example, also to a breathing movement or another excitation of an examined patient.

Figure 6:
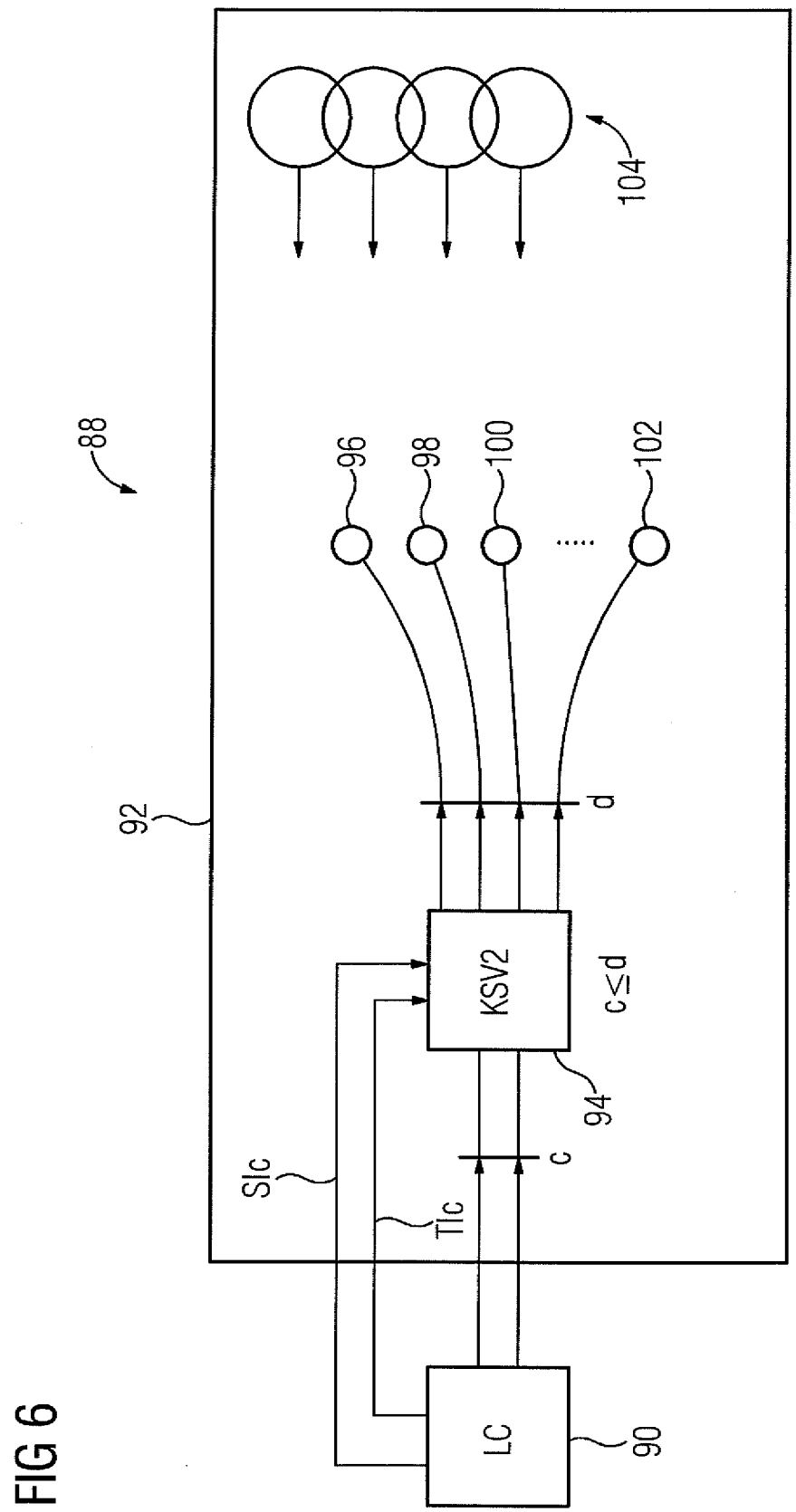
FIG. 6 shows one embodiment of a local coil array that represents a shim coil arrangement.

FIG. 6 shows a receiver 88 that may be connected to a coil socket of an MRT system by way of a coil plug 90. The receiver 88 receives c coil currents overall, a control signal S1c and a trigger signal T1c via the coil plug 90. The currents and signals are transmitted to a switching matrix 94 integrated in a housing 92 of the receiver 88. The c coil currents are guided on d shim coil connections by the switching matrix 94, to which a total of d shim coils 96 to 102 are connected. In addition to the shim coils 96 to 102, a receive coil array 104, the signals of which are likewise transmitted via the coil plug 90 out of the receiver 88 to an evaluation device (not shown), is still found in the housing 92. Tomograms are calculated by the evaluation device from the received signals.

Figure 7:
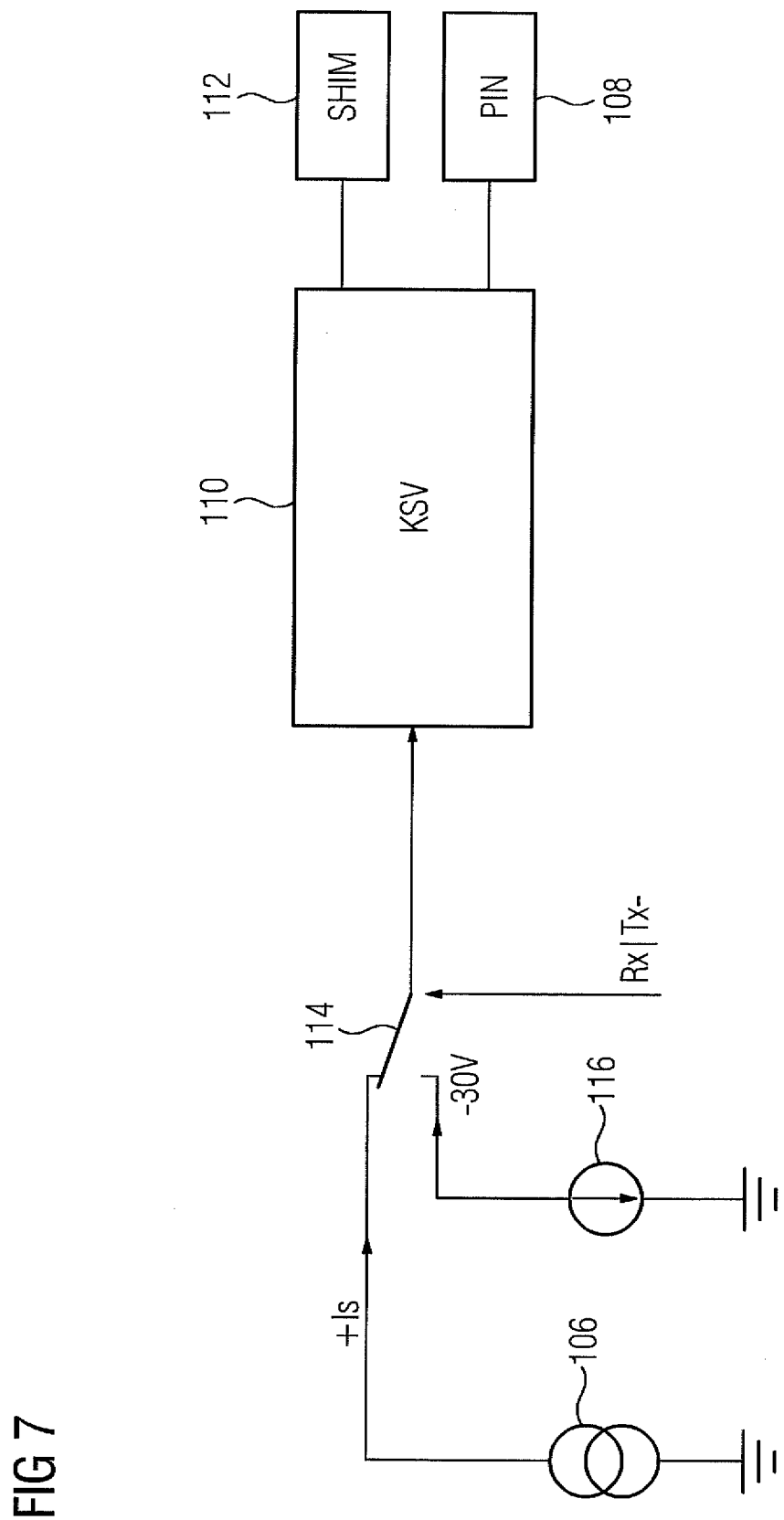
FIG. 7 shows one embodiment of a circuit arrangement for operating a tuning device of the MRT system.

FIG. 7 illustrates how a shim current source 106 in an MRT system may also be used as a current source for a PIN diode 108. If the shim current source 106 is not used for shimming (e.g., for generating a balancing field), the shim current source 106 may be separated, for example, from a shim coil 112 (SHIM) via a switching matrix 110 of the MRT system. The current Is is fed to the PIN diode 108. A switch 114 may also be provided. The switch 114 is switched as a function of a receive/transmit signal that functions as a trigger signal and specifies points in time, at which a change is made between the transmit operation for exciting a magnetic resonance in a body and a receive operation for receiving the alternating field irradiated by the body. In order to block the PIN diode 108, during the receive operation, the PIN diode 108 may be coupled via the switching matrix 110 and the switch 114 to a voltage source 116, for example. The switch 114 then switches the PIN diode into a blocking state.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography (MRT) system comprising:
    a controllable switching matrix;
    a controller that generates a control signal as a function of information relating to a field inhomogeneity of a magnetic field of the MRT system; and
    a plurality of controllable shim current sources coupled to the controller, wherein each controllable shim current source of the plurality of controllable shim current sources generates a coil current as a function of the control signal,
    wherein the plurality of shim current sources is coupled to a plurality of shim coil connections via the controllable switching matrix,
    wherein at least two shim current sources of the plurality of shim current sources are combined and supplied at a same time to one shim coil connection of the plurality of shim coil connections,
    wherein a number of shim coil connections in the plurality of shim coil connections is greater than a number of shim current sources in the plurality of shim current sources, and
    wherein at least one shim coil is connectable to each shim coil connection of the plurality of shim coil connections in order to generate a magnetic balancing field.

2. The MRT system as claimed in claim 1, wherein the at least two shim current sources of the plurality of shim current sources differ in terms of a maximum generateable current strength, a setting accuracy for a current strength, a switching bandwidth, or a combination thereof.

3. The MRT system as claimed in claim 1, wherein the at least two shim current sources of the plurality of shim current sources are configured as constant current sources, and
    wherein a switching bandwidth in the at least two shim current sources are each greater than a switching bandwidth of a gradient system of the MRT system.

4. The MRT system as claimed in claim 1, wherein at least one shim coil connection of the plurality of shim coil connections is integrated in a receive coil socket, via which a receiver with at least one receive coil is coupleable to the MRT system in order to receive an MR signal.

5. The MRT system as claimed in claim 1, wherein the switching matrix forms one only partially occupied matrix arrangement.

6. The MRT system as claimed in claim 1, further comprising at least one switch, via which a current of the at least two shim current sources of the plurality of shim current sources are deflectable away from a shim coil and towards a PIN diode of a tuning circuit.

7. The MRT system as claimed in claim 1, wherein the switching matrix is configured as a crossbar distributor.

8. The MRT system as claimed in claim 1, wherein a shim coil is connected to one shim coil connection of the plurality of shim coil connections, and
 wherein the shim coil is integrated in a patient couch or is moveable in the magnetic field and is disposable in a position close to a patient.

9. A shim coil arrangement comprising:
 a plurality of shim coils;
 a housing to be attached to a body of a patient to be examined, wherein the shim coils are integrated in the housing; and
 a switching matrix integrated into the housing,
 wherein the shim coils are coupled to a plug via the switching matrix,
 wherein the shim coil arrangement is connectable to a magnetic resonance tomography (MRT) system using the switching matrix via a plurality of shim coil connections in order to supply the shim coils with power via a plurality of shim current sources,
 wherein at least two shim current sources of the plurality of shim current sources are combined and supplied at a same time to one shim coil connection of the plurality of shim coil connections,
 wherein a number of shim coil connections in the plurality of shim coil connections is greater than a number of shim current sources in the plurality of shim current sources, and
 wherein the shim coil arrangement, with the MRT system, generates a magnetic balancing field.

10. The shim coil arrangement as claimed in claim 9, wherein at least one receive coil is also integrated in the housing.

11. The shim coil arrangement as claimed in claim 10, further comprising a switch, via which a current received via the plug is feedable to one of the shim coils or to a PIN diode of a tuning circuit of the at least one receive coil.

12. The shim coil arrangement as claimed in claim 9, wherein the switching matrix is configured as a crossbar distributor.

13. A method for balancing out a field inhomogeneity in a magnetic field of a magnetic resonance tomography (MRT) system, the method comprising:
 determining, with a controller, a value for a coil current as a function of information relating to the field inhomogeneity and information relating to a position of at least one shim coil arranged in the magnetic field,
 transmitting the value for the coil current to the at least one shim coil in order to generate a magnetic balancing field to balance out the field inhomogeneity; and
 generating, as a function of the value for the coil current, a control signal for at least two shim current sources and for at least one switching matrix combining and supplying the at least two shim current sources to the at least one shim coil at a same time;
 forming a combination of shim currents and a switching combination of the at least one switching matrix; and
 generating a balancing field using the combination of shim currents and the switching combination of the at least one switching matrix.

14. The method as claimed in claim 13, further comprising routing a current of the at least two shim current sources to at least one PIN diode of a tuning circuit.

* * * * *